US 6,566,214 B1

(12) United States Patent
Lyons et al.

(10) Patent No.: US 6,566,214 B1
(45) Date of Patent: May 20, 2003

(54) METHOD OF MAKING A SEMICONDUCTOR DEVICE BY ANNEALING A METAL LAYER TO FORM METAL SILICIDE AND USING THE METAL SILICIDE AS A HARD MASK TO PATTERN A POLYSILICON LAYER

(75) Inventors: Christopher F. Lyons, Fremont, CA (US); Ramkumar Subramanian, Sunnyvale, CA (US); Scott A. Bell, San Jose, CA (US); Todd P. Lukanc, San Jose, CA (US); Marina V. Plat, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/047,036

(22) Filed: Jan. 17, 2002

(51) Int. Cl.[7] ............... H01L 21/3213; H01L 21/336
(52) U.S. Cl. ............... 438/305; 438/592; 438/655; 438/682; 438/683
(58) Field of Search ............... 438/301, 303, 438/306, 586, 592, 595, 648, 649, 655, 682, 683, 305

(56) References Cited

U.S. PATENT DOCUMENTS

| | | | | |
|---|---|---|---|---|
| 4,460,435 A | * | 7/1984 | Maa | 156/643 |
| 4,818,715 A | * | 4/1989 | Chao | 437/44 |
| 5,134,085 A | * | 7/1992 | Gilgen et al. | 437/52 |
| 5,160,407 A | * | 11/1992 | Latchford et al. | 156/656 |
| 5,283,449 A | * | 2/1994 | Ooka | 257/204 |
| 5,431,770 A | * | 7/1995 | Lee et al. | 156/653.1 |
| 5,498,555 A | * | 3/1996 | Lin | 437/35 |
| 5,605,854 A | * | 2/1997 | Yoo | 437/44 |
| 5,955,761 A | * | 9/1999 | Yoshitomi et al. | 257/336 |
| 6,046,098 A | * | 4/2000 | Iyer | 438/622 |
| 6,069,044 A | * | 5/2000 | Wu | 438/299 |
| 6,127,249 A | * | 10/2000 | Hu | 438/583 |
| 6,159,856 A | * | 12/2000 | Nagano | 438/683 |
| 6,204,105 B1 | * | 3/2001 | Jung | 438/238 |

OTHER PUBLICATIONS

Stanley Rolf: "Silicon Processing for the VLSI Era, vol. 2: Process Integration," 1990, pp. 144–152, Lattice Press, Sunset Beach, California.

* cited by examiner

Primary Examiner—Carl Whitehead, Jr.
Assistant Examiner—Stephen W. Smoot
(74) Attorney, Agent, or Firm—Foley & Lardner

(57) ABSTRACT

A method of making a semiconductor device is provided. A polysilicon layer is formed over a substrate and a metal layer is formed on the polysilicon layer. The metal layer and the polysilicon layer are annealed to form a metal silicide layer on the polysilicon layer. The metal silicide layer is patterned and the polysilicon layer is then patterned using the patterned metal silicide layer as a mask. The patterned metal silicide and polysilicon layers may be used as a gate electrode of a MOSFET.

28 Claims, 5 Drawing Sheets

METHOD OF MAKING A SEMICONDUCTOR DEVICE BY ANNEALING A METAL LAYER TO FORM METAL SILICIDE AND USING THE METAL SILICIDE AS A HARD MASK TO PATTERN A POLYSILICON LAYER

BACKGROUND OF THE INVENTION

A. Field of the Invention

The invention relates generally to semiconductor device manufacturing and, more particularly, to using a silicide hard mask to pattern a gate electrode.

B. Description of the Related Art

In a conventional metal oxide semiconductor field effect transistor (MOSFET), the gate electrode includes a lower layer of doped polysilicon and an upper layer of metal silicide, such as titanium silicide. The metal silicide layer is conventionally formed by the salicide process illustrated in FIGS. 1A–E. Field oxide regions 2 and gate oxide layer 3 are formed on a silicon substrate 1. A polysilicon layer 5 is then formed on the gate oxide layer 3, as illustrated in FIG. 1A. The polysilicon layer 5 and the gate oxide layer 3 are then patterned by conventional photolithography to form a lower gate electrode layer 5A and a gate oxide 3A. Lightly doped source and drain regions 7A, 9A are then implanted into the substrate 1, using the gate electrode layer 5A as a mask, as shown in FIG. 1B. A silicon oxide layer is then deposited over the lower gate electrode layer 5A and anisotropically etched to form sidewall spacers 11A and 11B. Heavily doped source and drain regions 7B, 9B are then implanted into the substrate 1 using the lower gate electrode layer 5A and the sidewall spacers 11A, 11B as a mask, as shown in FIG. 1C. A metal layer 13, such as a titanium layer, is then deposited on the polysilicon gate electrode layer 5A, the sidewall spacers 11A, 11B and the exposed doped silicon source 7B and drain regions 9B, as illustrated in FIG. 1D. The resulting device is then annealed to react the metal layer 13 with the exposed polysilicon lower gate electrode layer 5A to form an upper metal silicide gate electrode layer 15 on the lower polysilicon gate electrode layer 5A and metal silicide contact layers 17, 19 on the source 7B and drain regions 9B. The metal layer 13 does not substantially react with the oxide sidewall spacers 11A, 11B. The portions of the metal layer 13 remaining over the spacers 11A, 11B are removed by a selective etch, which does not remove the silicide layers 15, 17 and 19, as shown in FIG. 1E.

The above described salicide process works well for wide gate electrodes. However, the present inventors have determined that when the salicide process is used to form narrow gate electrodes, for example gate electrodes having a width of less than 0.25 microns, such gate electrodes suffer from poor conductivity and poor contact resistance. Thus, it is desirable to improve the conductivity and contact resistance of a narrow gate electrode containing a lower polysilicon layer and an upper metal silicide layer.

SUMMARY OF THE INVENTION

According to one preferred aspect of the present invention, there is provided a method of making a semiconductor device, comprising forming a polysilicon layer over a substrate, forming a metal layer on the polysilicon layer, annealing the metal layer and the polysilicon layer to form a metal silicide layer on the polysilicon layer, patterning the metal silicide layer, and patterning the polysilicon layer using the patterned metal silicide layer as a mask.

According to another preferred aspect of the present invention, there is provided a method of making a semiconductor device, comprising forming a polysilicon layer over a substrate, forming a metal layer on the polysilicon layer, annealing the metal layer and the polysilicon layer to form a metal silicide layer on the polysilicon layer, forming a photoresist layer on the metal silicide layer, exposing the photoresist layer to radiation, patterning the photoresist layer to form a photoresist etching mask having a first width, etching the metal silicide layer using the photoresist etching mask as a mask to form a patterned metal silicide layer having a second width less than the first width, and etching the polysilicon layer using the patterned metal silicide layer as a mask.

According to another preferred aspect of the present invention, there is provided a method of making a MOSFET, comprising forming a gate insulating layer on a substrate, forming a polysilicon layer on the gate insulating layer, forming a metal layer on the polysilicon layer prior to patterning the polysilicon layer, annealing the metal layer and the polysilicon layer to form a metal silicide layer on the polysilicon layer, forming a photoresist layer on the metal silicide layer, exposing the photoresist layer to radiation, patterning the photoresist layer to form a photoresist etching mask having a first width, patterning the metal silicide layer using the photoresist etching mask as a mask to form an upper layer of a gate electrode, patterning the polysilicon layer using the patterned metal silicide layer as a mask to form a lower gate electrode layer, doping the substrate to form first doped source and drain regions having a first doping concentration using the gate electrode as a mask, and forming conductive contacts on the first doped source and drain regions.

DETAILED DESCRIPTION OF SPECIFIC EMBODIMENTS

The present inventors have realized that the poor conductivity and contact resistance of narrow polysilicon/metal silicide gate electrodes made by the salicide method is due to poor alloying of the metal layer to the narrow patterned polysilicon lower gate electrode layer. Therefore, the present inventors have realized that the conductivity and contact resistance of a polysilicon/metal silicide gate may be improved by forming the metal layer on the polysilicon layer and annealing the two layers to form the metal silicide layer prior to patterning the polysilicon layer. Subsequently, the metal silicide layer may be patterned and then used as a hard mask for patterning the polysilicon layer.

Figure 2A:
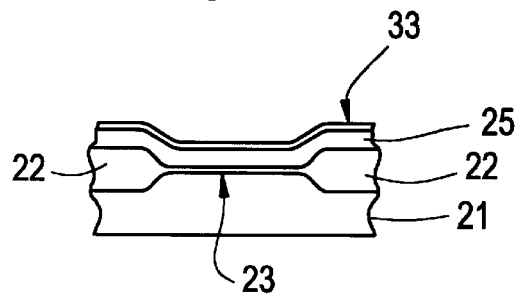
FIGS. 2A–2J are side cross sectional views of a method of making a MOSFET according to a first preferred embodiment of the present invention.

FIGS. 2A–2J illustrate a method of making a MOSFET according to a first preferred embodiment of the present invention. Field oxide regions 22 and a gate insulating layer 23 are formed on a substrate 21, as shown in FIG. 2A. The substrate 21 is preferably a silicon substrate, but may comprise other materials, such as GaAs, InP or a silicon layer on a glass substrate (i.e., for a thin film transistor, TFT). The gate insulating layer 23 may comprise any one or more desired insulating layers, such as silicon oxide, silicon nitride or silicon oxynitride.

Figure 1A:
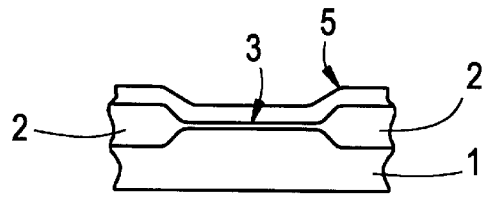
FIGS. 1A–1E are side cross sectional views of a prior art salicide method.
Figure 1B:
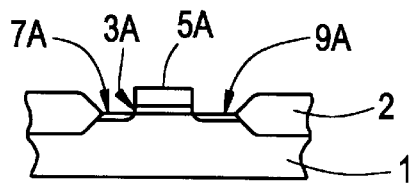
Figure 1C:
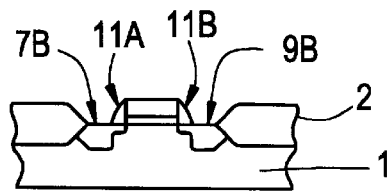
Figure 1D:
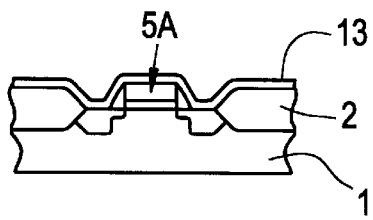
Figure 1E:
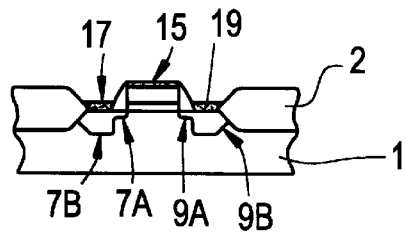

A polysilicon layer 25 is then formed on the gate insulating layer 23, as shown in FIG. 1A. Preferably, the polysilicon layer 25 is formed to a sufficient thickness and doped p or n type to a sufficient concentration to act as a lower layer of a gate electrode. The polysilicon layer is preferably 2000 to 5000 Angstroms, more preferably 3000 to 4000 Angstroms thick and has a sheet resistance of 10–40 ohms/sq, more preferably 15–20 ohms/sq.

A metal layer 33 is then formed on the polysilicon layer 25 prior to patterning the polysilicon layer 25 to form the lower layer of a gate electrode, as shown in FIG. 2A. The metal layer 33 may comprise any metal which can form a metal silicide by reacting with the polysilicon layer 25. For example, the metal layer 33 preferably comprises titanium, nickel or cobalt. However, any other metal which is capable of forming a silicide, such as tungsten, platinum or tantalum, may be used instead. Preferably, the metal layer 33 has a thickness of 50 to 1000 Angstroms, most preferably, 100–300 Angstroms. Layers 23, 25 and 33 may be formed by any conventional deposition method, such as by chemical vapor deposition (CVD) or by sputtering.

Figure 2B:
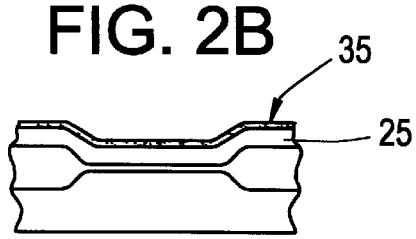

The metal layer 33 and the polysilicon layer 25 are then annealed to form a metal silicide layer 35 on the polysilicon layer 25, as shown in FIG. 2B. For example, the annealing may be carried out at 700° C. or less, such as at 650° C. for 20–60 minutes in a furnace, or for less than a minute in a rapid thermal annealing apparatus. The anneal may be carried out in argon or nitrogen ambient, if desired. Furthermore, a second annealing step at a higher temperature, such as 700° C. to 800° C. may be added to decrease the metal silicide layer 35 sheet resistance. During the annealing step, the entire metal layer 33 and a portion of the polysilicon layer 25 are reacted to form the metal silicide layer 35. The preferred thickness of the resulting metal silicide layer 35 is 50 to 1000 Angstroms, most preferably, 100–300 Angstroms, such as 200 Angstroms. Preferably, the sheet resistivity of the metal silicide layer 35 is 0.5 to 2 ohms/sq. The preferred metal silicide layers comprise titanium sicide, nickel silicide or cobalt silicide. However, other metal silicide layers, such as tungsten, platinum or tantalum silicide layers may be formed.

Figure 2C:
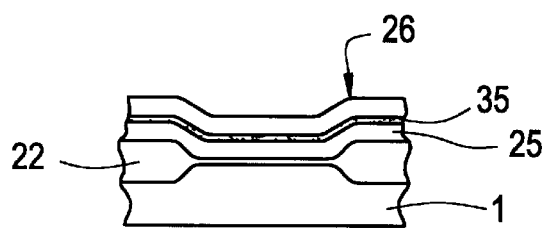

A photoresist layer 26 is then formed on the metal silicide layer 35, as shown in FIG. 2C. The photoresist layer 26 may have a thickness of 4000 to 6000 Angstroms for 193 nm or 248 nm exposing radiation. However, if desired, the photoresist layer 26 may comprise an ultra thin resist (UTR) having a thickness of 2500 Angstroms or less, such as 1000 to 2000 Angstroms. Such UTR layers are especially advantageous for low wavelength (i.e., 13 to 157 nm) lithography and for forming features having a linewidth of 2500 Angstroms or less on the substrate.

Figure 2D:
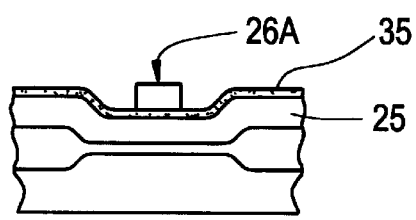

The photoresist layer 26 is then selectively exposed to radiation (i.e., 157, 193 or 248 nm UV radiation, for example). For example, the photoresist layer 26 may be selectively exposed to radiation through a mask or reticle or by scanning a laser or electron beam in a pattern over the photoresist layer 26. The exposed photoresist layer 26 is then patterned (i.e., developed) to form a photoresist etching mask 26A having a first width, as shown in FIG. 2D. Preferably, the first width is 2500 Angstroms or less, most preferably 1000 to 2000 Angstroms.

Figure 2E:
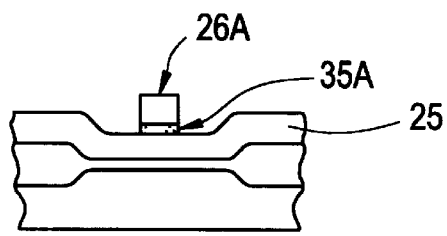

The metal silicide layer 35 is then patterned using the photoresist etching mask 26A as a mask to form an upper layer 35A of a gate electrode, as shown in FIG. 2E. For example, the metal silicide layer 35 may be anisotropically etched using a chlorine or a fluorine based plasma, such as $SF_6$, $SF_8$, $Cl_2$ and/or $CF_4$. The patterned metal silicide layer 35A can act as a hard mask for the subsequent patterning of the underlying polysilicon layer 25.

Figure 2F:
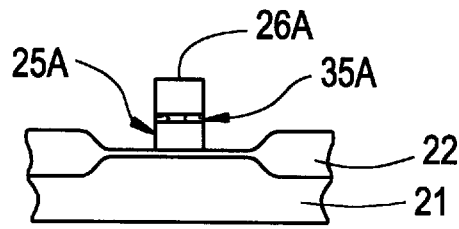

The polysilicon layer 25 is then patterned using the patterned metal silicide layer 35A as a mask to form a lower gate electrode layer 25A, as shown in FIG. 2F. The step of patterning the polysilicon layer 25 preferably comprises anisotropically etching the polysilicon layer 25 using the patterned metal silicide layer 35A and the photoresist etching mask 26A layer as a mask. Any etching gas or liquid which etches polysilicon, such as $CF_4$, $SF_6$ or other plasma may be used to anisotropically etch the polysilicon layer 25. If desired, the metal silicide layer 35 and the polysilicon layer 25 may be anisotropically, sequentially etched during a single etching step using the same etching gas, such as $CF_4$ plasma, using the photoresist etching mask 26A as a mask. However, the metal silicide layer 35 and the polysilicon layer 25 may also be etched during separate etching steps, using a different etching gas or liquid.

In an alternative aspect of the present invention, the photoresist etching mask 26A is removed after the step of patterning the metal silicide layer 35 but before the step of patterning the polysilicon layer 25. In this aspect of the present invention, the metal silicide layer 35 is anisotropically etched in a first etching step, and the polysilicon layer 25 is etched using only the patterned metal silicide layer 35A as a hardmask in a second etching step. In this case, the portions of the polysilicon layer 25 that are uncovered by the patterned metal silicide layer 35A are anisotropically etched by an etching gas or liquid that selectively etches polysilicon compared to metal silicide.

If desired, the gate insulating layer 23 that is not covered by the patterned polysilicon layer 25A is subsequently optionally etched. The insulating material of the gate insulating layer may be etched away by an etching gas or liquid that preferentially removes the insulating material (i.e., silicon oxide, nitride or oxynitride) but not the metal silicide layer 35A.

Figure 2G:
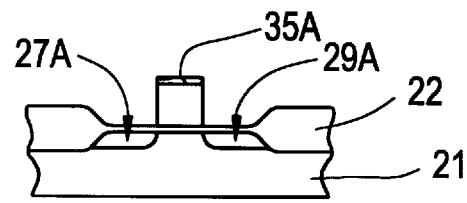

After patterning the gate electrode which comprises the upper metal silicide layer 35A and the lower polysilicon layer 25A, the substrate 21 may be optionally doped to form lightly doped source 27A and drain 29A regions, if a lightly doped drain (LDD) MOSFET configuration is required, as shown in FIG. 2G. Otherwise, this step may be omitted. The lightly doped source and drain regions may be formed by self aligned ion implantation of p or n type ions into an oppositely doped substrate 21 using the patterned polysilicon 25A and metal silicide layers 35A of the gate electrode as a mask. If the gate insulating layer 23 is not etched away, then the ion implantation is conducted through the exposed portions of the gate insulating layer.

Figure 2H:
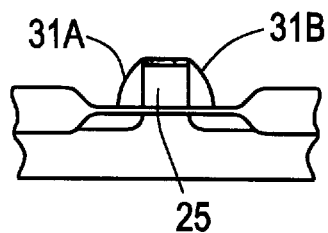

After the first ion implantation step, sidewall spacers 31A and 31B are formed on the gate electrode 25A/35A, as shown in FIG. 2H. The sidewall spacers 31A, 31B may be formed by depositing an insulating layer, such as a silicon oxide layer, over the gate electrode 25A/35A and anisotropically etching the insulating layer.

Figure 2I:
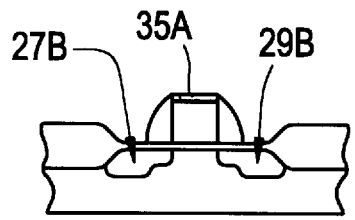

After forming the sidewall spacers 31A, 31B, the substrate 21 is doped to form heavily doped source 27B and drain 29B regions having a doping concentration higher than that of the lightly doped source 27A and drain 29A regions. The heavily doped source and drain regions may be formed by self aligned ion implantation using the gate electrode 25A/35A and the sidewall spacers 31A, 31B as a mask, as shown in FIG. 2I.

Figure 2J:
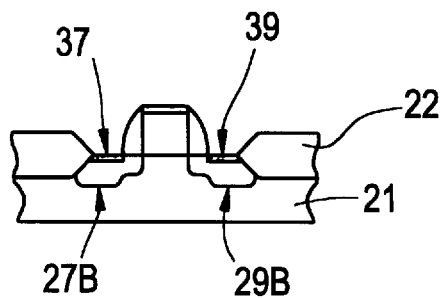

After the source 27A/27B and drain 29A/29B regions are formed in the substrate 21, conductive contacts 37, 39 are formed on the source 27B and drain 29B regions, respectively, as shown in FIG. 2J. The conductive contacts 37, 39 may comprise any one or more conductive materials, such as aluminum, doped polysilicon, titanium nitride, titanium and/or metal silicide.

If desired, the contacts 37, 39 may comprise metal silicide contacts made by the salicide process. The salicide process includes forming a second metal layer, such as titanium, on the heavily doped source 27B and drain 29B regions, on the sidewall spacers 31A and 31B and over the metal silicide layer 35. If desired, an additional, second polysilicon layer may optionally be formed and patterned over the patterned metal silicide layer 35A prior to forming the sidewall spacers 31A, 31B in order to improve the conductivity of the gate electrode. The second metal layer is annealed to form metal silicide contacts 37, 39 on the heavily doped source 27B and drain 29B regions. Preferably, the second metal layer comprises the same metal as the first metal layer 33, such that it is at least partially integrated into the metal silicide layer 35A or forms a second metal silicide layer by reaction with the optional second polysilicon layer, if the second polysilicon layer is present. The portions of the second metal layer remaining on the sidewall spacers 31A, 31B and/or the metal silicide layer 35A are then selectively etched away using a selective etching liquid, such as distilled water/$H_2O_2$/$NH_4OH$ (5:1:1) to form the contacts 37, 39.

FIGS. 3A–D and 4A–D illustrate alternative preferred embodiments of the present invention, where the photoresist layer is patterned to form a photoresist etching mask having a first width, and the metal silicide layer is patterned to form a patterned metal silicide hard mask having a second width less than the first width. All elements shown in FIGS. 3A–D and 4A–D are the same as in FIGS. 2A–J, unless otherwise noted.

Figure 3A:
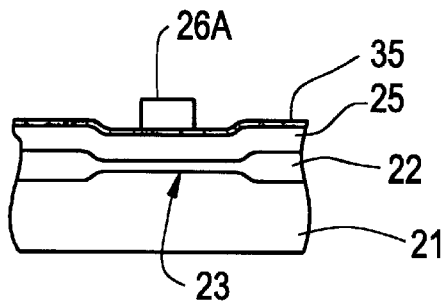
FIGS. 3A–3D are side cross sectional views of a method of patterning a gate electrode of a MOSFET according to a second preferred embodiment of the present invention.

FIGS. 3A–3D illustrate a method of making a MOSFET using a photoresist trim process, according to a second preferred embodiment of the present invention. FIG. 3A illustrates the device shown in FIG. 2D. The device shown FIG. 3A is formed by the method of FIGS. 2A–2D, as described above.

Figure 3B:
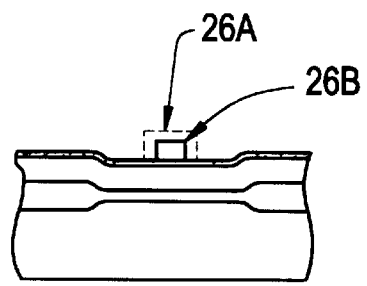

In FIG. 3A, the photoresist etching mask having a first width 26A is formed on the metal silicide layer 35 and the polysilicon layer 25. However, instead of using the photoresist etching mask 26A as a mask to etch the metal silicide layer 35, the photoresist etching mask 26A is trimmed to form a second photoresist etching mask 26B having a narrower width than the first mask 26A. The mask 26A is trimmed by isotropically etching it to form a photoresist etching mask 26B having the second width less than the first width prior to the step of patterning the metal silicide layer 35, as shown in FIG. 3B. During the isotropic etching, both the initial thickness and width of the mask 26A (shown by the dotted line in FIG. 3B) are reduced. For example, the width of the mask 26B is preferably 0.06 to 0.14 microns, most preferably 0.07 to 0.1 microns. Any suitable etching gas or liquid capable of isotropically etching photoresist, such as an oxygen containing plasma, may be used to trim the mask 26A.

Figure 3C:
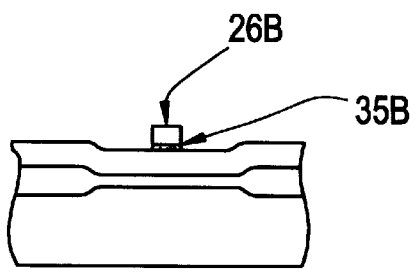
Figure 3D:
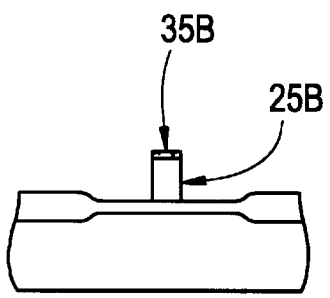

After the photoresist etching mask trimming process, the metal silicide layer 35 is anisotropically etched using the second photoresist etching mask 26B as a mask to form a patterned metal silicide layer 35B which acts as an upper layer of a gate electrode, as shown in FIG. 3C. As shown in FIG. 3D, the patterned metal silicide layer 35B is then used as a mask to pattern the polysilicon layer 25 to form the lower layer 25B of the gate electrode, as described above. The photoresist etching mask 26B may be removed before or after the polysilicon layer 25 etching step shown in FIG. 3D. The gate electrode 25B/35B of the second preferred embodiment has a narrower width than the gate electrode 25A/35A of the first preferred embodiment. For example, the width of the gate electrode 25B/35B may be 0.25 microns or less, preferably, 0.06 to 0.14 microns, most preferably 0.07 to 0.1 microns. The MOSFET is then completed, as shown in FIGS. 2G–2J and as described above.

Figure 4A:
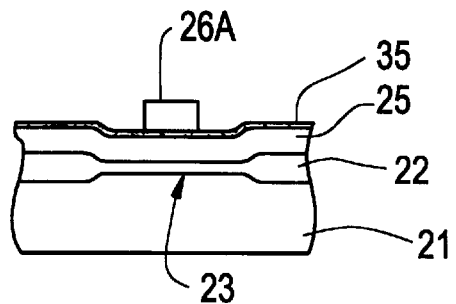
FIGS. 4A–4D are side cross sectional views of a method of patterning a gate electrode of a MOSFET according to a third preferred embodiment of the present invention.

FIGS. 4A–4D illustrate a method of making a MOSFET using a silicide hardmask trim process, according to a third preferred embodiment of the present invention. FIG. 4A illustrates the device shown in FIG. 2D. The device shown FIG. 4A is formed by the method of FIGS. 2A–2D, as described above.

Figure 4B:
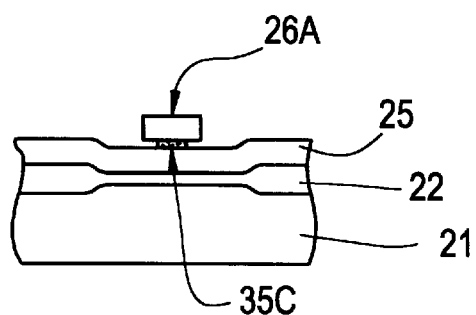

In FIG. 4A, the photoresist etching mask having a first width 26A is formed on the metal silicide layer 35 and the polysilicon layer 25. However, instead of using the photoresist etching mask 26A as a mask to anisotropically etch the metal silicide layer 35, metal silicide layer 35 is isotropically over-etched. During the isotropic over-etching, the mask 26A is undercut, to form a patterned metal silicide layer 35C, as shown in FIG. 4B. For example, the width of the patterned metal silicide layer 35C is preferably 0.06 to 0.14 microns, most preferably 0.07 to 0.1 microns. Preferably, an etching liquid is used to preferentially etch the metal silicide layer 35 to form the upper layer of the gate electrode 35C, such that the patterned metal silicide layer 35C has a third width which is less than the first width of the photoresist etching mask 26A. Any suitable etching liquid capable of isotropically etching the metal silicide layer may be used to trim the silicide layer.

Figure 4C:
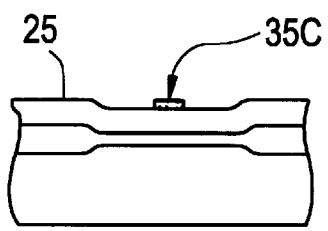

By leaving the mask 26A on the metal silicide layer 35 during the isotropic etching, the width, but not the thickness of the metal silicide layer is reduced. Therefore, the patterned metal silicide layer 35C has a sufficient thickness to act as a hardmask during the subsequent etching of the polysilicon layer 25. The mask 26A is then removed as shown in FIG. 4C.

However, in an alternative aspect of the third preferred embodiment, the photoresist etching mask 26 may be removed before the isotropic etching of the metal silicide layer 35. In this case, the metal silicide layer 35 is first anisotropically etched using the photoresist etching mask 26A, as shown in FIG. 2E. The mask 26A is then removed, and the exposed patterned metal silicide layer 35A of FIG. 2E is isotropically etched to form the patterned metal silicide layer 35C having a smaller width and thickness than layer 35A, as shown in FIG. 4B. In this aspect of the third preferred embodiment, the metal silicide layer 35 should have a sufficient initial thickness such that the patterned metal silicide layer 35C has a sufficient thickness remaining after the isotropic etching to act as a hardmask during the etching of the polysilicon layer 25.

Figure 4D:
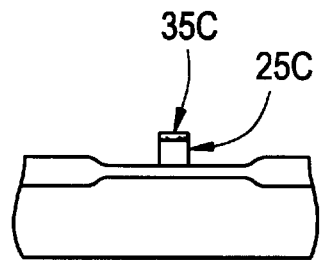

After the hardmask trimming process, the patterned metal silicide layer 35C is then used as a hardmask to pattern the polysilicon layer 25 to form the lower layer 25C of the gate electrode, as shown in FIG. 4D. The gate electrode 25C/35C of the third preferred embodiment has a narrower width than the gate electrode 25A/35A of the first preferred embodiment. For example, the width of the gate electrode 25C/35C may be 0.25 microns or less, preferably, 0.06 to 0.14 microns, most preferably 0.07 to 0.1 microns. The MOSFET is then completed, as shown in FIGS. 2G–2J and as described above.

The method of the preferred embodiments is advantageous because it allows the metal silicide layer to be used as a hardmask during the etching of the underlying polysilicon layer. The method of the preferred embodiments is especially advantageous for forming small metal silicide/polysilicon features with high conductivity and low contact resistance. By forming the metal silicide layer on the polysilicon prior to patterning the polysilicon layer, a good quality silicide material may be obtained compared to forming a metal silicide on a narrow, patterned polysilicon layer.

Furthermore, since the silicide hardmask may be made thin, such as 100–300 Angstroms thick, a thin photoresist layer, such as a UTR layer, may be used as a mask in a preferred aspect of the present invention. Thus, a thin photoresist layer may be used to etch a thin underlying silicide layer because the thin photoresist layer would not significantly erode during the quick etching of the thin hardmask layer. In contrast, a thick photoresist layer is required to etch the thick polysilicon layer in the prior art salicide process because a thin photoresist layer, such as a UTR layer, would erode away during the time consuming etching of the thick polysilicon layer. The thin photoresist allows the use of shorter wavelength exposing radiation compared to the thick 4000–5000 Angstrom photoresists, which allows the achievement of smaller mask widths and line widths of the conductive features compared to the prior art salicide process. Furthermore, by using photoresist or hardmask trimming of the second and third preferred embodiments, even smaller mask widths and line widths of the conductive features may be achieved compared to the prior art salicide process.

While the preferred embodiments have been described with respect to forming metal silicide/polysilicon gate electrodes for a MOSFET, the present invention is not limited to forming gate electrodes. The metal silicide/polysilicon pattern described above may comprise any other conductive feature in a solid state device, such as electrodes which contact a doped region of a semiconductor device or interconnects in upper level metallization of a semiconductor device. Furthermore, a single crystal silicon layer may be used instead of the polysilicon layer.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

What is claimed is:

1. A method of making a semiconductor device, comprising:
    forming a polysilicon layer over a substrate;
    forming a metal layer on the polysilicon layer;
    annealing the metal layer and the polysilicon layer to form a metal silicide layer on the polysilicon layer;
    patterning the metal silicide layer by:
        forming a photoresist layer on the metal silicide layer;
        exposing the photoresist layer to radiation;
        patterning the exposed photoresist layer to form a photoresist etching mask having a first width; and
    etching the metal silicide layer using the photoresist etching mask layer as a mask;
    patterning the polysilicon layer using the patterned metal silicide layer as a mask; and
    at least one of the following:
        (A) wherein the step of etching the metal silicide layer and the step of patterning the polysilicon layer comprise anisotropically etching the metal silicide layer and the polysilicon layer during a single etching step using the photoresist etching mask as a mask; or
        (B) further comprising removing the photoresist etching mask after the step of etching the metal silicide layer but before the step of patterning the polysilicon layer; or
        (C) wherein the step of etching the metal silicide layer comprises:
            anisotropically etching the metal silicide layer using the photoresist etching mask layer as a mask; and
            isotropically etching the metal silicide layer after removing the photoresist etching mask.

2. The method of claim 1, wherein the step of patterning the polysilicon layer comprises etching the polysilicon layer using the patterned metal silicide layer and the photoresist etching mask layer as a mask.

3. The method of claim 1, wherein the step of etching the metal silicide layer and the step of patterning the polysilicon layer comprise anisotropically etching the metal silicide layer and the polysilicon layer during a single etching step using the photoresist etching mask as a mask.

4. The method of claim 1, comprising removing the photoresist etching mask after the step of etching the metal silicide layer but before the step of patterning the polysilicon layer.

5. The method of claim 1, wherein the step of etching the metal silicide layer and the step of patterning the polysilicon layer comprise anisotropically etching the metal silicide layer in a first etching step and anisotropically etching the polysilicon layer in a separate, second etching step.

6. The method of claim 1, further comprising isotropically etching the photoresist etching mask to form a photoresist etching mask having a second width less than the first width prior to the step of etching the metal silicide layer.

7. The method of claim 1, wherein the step of etching the metal silicide layer comprises isotropically etching the metal silicide layer using the photoresist etching mask as a mask such that the isotropically etched metal silicide layer has a third width which is less than the first width.

8. The method of claim 1, wherein the step of etching the metal silicide layer comprises:
    anisotropically etching the metal silicide layer using the photoresist etching mask layer as a mask; and
    isotropically etching the metal silicide layer after removing the photoresist etching mask.

9. The method of claim 1, further comprising:
    forming a gate insulating layer on the substrate prior to forming the polysilicon layer;
    lightly doping the substrate to form lightly doped source and drain regions using the patterned polysilicon layer as a mask;
    forming sidewall spacers on the patterned polysilicon layer and the patterned metal silicide layer;
    heavily doping the substrate to form heavily doped source and drain regions using the patterned polysilicon layer and the sidewall spacers as a mask;

forming a second metal layer on the heavily doped source and drain regions, on the sidewall spacers and over the metal silicide layer;

annealing the second metal layer to form metal silicide contacts on the heavily doped source and drain regions; and selectively etching the second metal layer to remove portions of the second metal layer remaining on the sidewall spacers.

10. The method of claim 1, wherein:

the metal layer is selected from a group consisting of titanium, nickel and cobalt;

the metal silicide layer is selected from a group consisting of titanium silicide, nickel silicide and cobalt silicide; and the patterned polysilicon layer has a width of 0.25 microns or less.

11. A method of making a semiconductor device, comprising:

forming a polysilicon layer over a substrate;

forming a metal layer on the polysilicon layer;

annealing the metal layer and the polysilicon layer to form a metal silicide layer on the polysilicon layer;

forming a photoresist layer on the metal silicide layer;

exposing the photoresist layer to radiation;

patterning the photoresist layer to form a photoresist etching mask having a first width;

etching the metal silicide layer using the photoresist etching mask as a mask to form a patterned metal silicide layer having a second width less than the first width;

etching the polysilicon layer using the patterned metal silicide layer as a mask; and at least one of the following:

(A) wherein the step of etching the metal silicide layer comprises:

anisotropically etching the metal silicide layer using the photoresist etching mask layer as a mask; and isotropically etching the metal silicide layer after removing the photoresist etching mask, such that the isotropically etched metal silicide layer has the second width which is less than the first width; or (B) wherein:

the metal silicide layer has a thickness of 100–300 angstroms;

the photoresist layer has a thickness of 2500 angstroms or less; and the second width of the patterned metal silicide layer is 0.06 to 0.14 microns.

12. The method of claim 11, further comprising isotropically etching the photoresist etching mask to form a photoresist etching mask having the second width less than the first width prior to the step of etching the metal silicide layer.

13. The method of claim 12, wherein the step of etching the metal silicide layer comprises anisotropically etching the metal silicide layer using the photoresist etching mask having the second width as a mask.

14. The method of claim 11, further comprising isotropically etching the metal silicide layer prior to the step of etching the polysilicon layer using the photoresist etching mask as a mask such that the isotropically etched metal silicide layer has the second width which is less than the first width.

15. The method of claim 11, wherein the step of etching the metal silicide layer comprises:

anisotropically etching the metal silicide layer using the photoresist etching mask layer as a mask; and isotropically etching the metal silicide layer after removing the photoresist etching mask, such that the isotropically etched metal silicide layer has the second width which is less than the first width.

16. The method of claim 11, wherein:

the metal silicide layer has a thickness of 100–300 angstroms;

the photoresist layer has a thickness of 2500 angstroms or less; and the second width of the patterned metal silicide layer is 0.06 to 0.14 microns.

17. The method of claim 11, further comprising:

forming a gate insulating layer on the substrate prior to forming the polysilicon layer;

lightly doping the substrate to form lightly doped source and drain regions using the patterned polysilicon layer as a mask;

forming sidewall spacers on the patterned polysilicon layer and the patterned metal suicide layer;

heavily doping the substrate to form heavily doped source and drain regions using the patterned polysilicon layer and the sidewall spacers as a mask;

forming a second metal layer on the heavily doped source and drain regions, on the sidewall spacers and over the first metal silicide layer;

annealing the second metal layer to form metal silicide contacts on the heavily doped source and drain regions; and selectively etching the second metal layer to remove portions of the second metal remaining on the sidewall spacers.

18. The method of claim 11, wherein:

the metal layer is selected from a group consisting of titanium, nickel and cobalt;

the metal silicide layer is selected from a group consisting of titanium silicide, nickel silicide and cobalt silicide; and the patterned polysilicon layer has a width of 0.25 microns or less.

19. A method of making a MOSFET, comprising:

forming a gate insulating layer on a substrate;

forming a polysilicon layer on the gate insulating layer;

forming a metal layer on the polysilicon layer prior to patterning the polysilicon layer;

annealing the metal layer and the polysilicon layer to form a metal silicide layer on the polysilicon layer;

forming a photoresist layer on the metal silicide layer;

exposing the photoresist layer to radiation;

patterning the photoresist layer to form a photoresist etching mask having a first width;

patterning the metal silicide layer using the photoresist etching mask as a mask to form an upper layer of a gate electrode;

patterning the polysilicon layer using the patterned metal silicide layer as a mask to form a lower gate electrode layer;

patterning the gate insulating layer using the gate electrode as a mask after the step of patterning the polysilicon layer;

doping the substrate to form first doped source and drain regions having a first doping concentration using the gate electrode as a mask;

forming conductive contacts on the first doped source and drain regions;

doping the substrate to form second doped source and drain regions having a second doping concentration lower than the first doping concentration using the gate electrode as a mask;

forming sidewall spacers on the gate electrode after forming the second source and drain regions and before forming the first source and drain regions; and at least one of the following:
(A) wherein the step of patterning the metal silicide layer and the step of patterning the polysilicon layer comprise anisotropically etching the metal silicide layer and the polysilicon layer during a single etching step using the photoresist etching mask as a mask; or
(B) further comprising removing the photoresist etching mask after the step of patterning the metal silicide layer but before the step of patterning the polysilicon layer; or
(C) wherein the step of patterning the metal suicide layer comprises:
anisotropically etching the metal silicide layer using the photoresist etching mask layer as a mask;
removing the photoresist etching mask; and
isotropically etching the metal silicide layer after removing the photoresist etching mask.

20. The method of claim 19, wherein the step of patterning the polysilicon layer comprises etching the polysilicon layer using the patterned metal silicide layer and the photoresist etching mask layer as a mask.

21. The method of claim 19, wherein the step of patterning the metal silicide layer and the step of patterning the polysilicon layer comprise anisotropically etching the metal silicide layer and the polysilicon layer during a single etching step using the photoresist etching mask as a mask.

22. The method of claim 19, comprising removing the photoresist etching mask after the step of patterning the metal silicide layer but before the step of patterning the polysilicon layer.

23. The method of claim 19, wherein the step of patterning the metal silicide layer and the step of patterning the polysilicon layer comprise anisotropically etching the metal silicide layer in a first etching step and anisotropically etching the polysilicon layer in a separate, second etching step.

24. The method of claim 19, further comprising isotropically etching the photoresist etching mask to form a photoresist etching mask having a second width less than the first width prior to the step of patterning the metal silicide layer.

25. The method of claim 19, further comprising isotropically etching the metal silicide layer using the photoresist etching mask as a mask such that the isotropically etched metal silicide layer has a second width which is less than the first width.

26. The method of claim 19, wherein the step of patterning the metal silicide layer comprises:
anisotropically etching the metal silicide layer using the photoresist etching mask layer as a mask;
removing the photoresist etching mask; and
isotropically etching the metal silicide layer after removing the photoresist etching mask.

27. The method of claim 19, wherein:
the metal layer is selected from a group consisting of titanium, nickel and cobalt;
the metal silicide layer is selected from a group consisting of titanium silicide, nickel silicide and cobalt silicide; and
the patterned polysilicon layer has a width of 0.25 microns or less.

28. The method of claim 19, wherein the step of forming conductive contacts on the first doped source and drain regions comprises:
forming a second metal layer on the first doped source and drain regions, on the sidewall spacers and over the metal suicide layer;
annealing the second metal layer to form metal silicide contacts on the first doped source and drain regions; and
selectively etching the second metal layer to remove portions of the second metal layer remaining on the sidewall spacers.

* * * * *